United States Patent
Kim et al.

(10) Patent No.: US 9,189,328 B2
(45) Date of Patent: Nov. 17, 2015

(54) MEMORY CONTROLLER AND METHOD OF OPERATING THE SAME

(71) Applicant: SAMSUNG ELECTRONICS CO., LTD., Suwon-si, Gyeonggi-do (KR)

(72) Inventors: Sang-Min Kim, Ulwang-si (KR); Jun-Jin Kong, Yongin-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 82 days.

(21) Appl. No.: 14/079,659

(22) Filed: Nov. 14, 2013

(65) Prior Publication Data

US 2014/0164875 A1 Jun. 12, 2014

(30) Foreign Application Priority Data

Dec. 11, 2012 (KR) .................. 10-2012-0143768

(51) Int. Cl.
G11C 29/00 (2006.01)
H03M 13/00 (2006.01)
G06F 11/10 (2006.01)
H03M 13/11 (2006.01)

(52) U.S. Cl.
CPC ....... *G06F 11/1012* (2013.01); *H03M 13/1105* (2013.01); *H03M 13/116* (2013.01)

(58) Field of Classification Search
None
See application file for complete search history.

(56) References Cited

U.S. PATENT DOCUMENTS

| | | | |
|---|---|---|---|
| 7,139,959 B2 | 11/2006 | Hocevar | |
| 7,178,080 B2 * | 2/2007 | Hocevar | 714/752 |
| 7,299,397 B2 | 11/2007 | Yokokawa et al. | |
| 7,730,377 B2 | 6/2010 | Hocevar | |
| 8,161,345 B2 | 4/2012 | Graef | |
| 8,601,352 B1 * | 12/2013 | Anholt et al. | 714/790 |
| 2008/0082868 A1 * | 4/2008 | Tran et al. | 714/699 |
| 2008/0276156 A1 * | 11/2008 | Gunnam et al. | 714/801 |
| 2009/0013237 A1 * | 1/2009 | Lin et al. | 714/758 |
| 2009/0106620 A1 | 4/2009 | Yokokawa | |
| 2009/0228767 A1 | 9/2009 | Oh et al. | |
| 2010/0138721 A1 * | 6/2010 | Tran et al. | 714/755 |
| 2010/0174964 A1 | 7/2010 | Lakkis | |
| 2011/0126078 A1 | 5/2011 | Ueng et al. | |
| 2011/0191650 A1 | 8/2011 | Yokokawa | |
| 2012/0284583 A1 * | 11/2012 | Tran et al. | 714/752 |
| 2013/0031440 A1 * | 1/2013 | Sharon et al. | 714/758 |
| 2013/0145231 A1 * | 6/2013 | Frayer et al. | 714/763 |
| 2013/0283131 A1 * | 10/2013 | Tsatsaragkos et al. | 714/776 |
| 2014/0075266 A1 * | 3/2014 | Fujiwara et al. | 714/763 |
| 2014/0075267 A1 * | 3/2014 | Koji | 714/764 |
| 2014/0089768 A1 * | 3/2014 | Fujiwara et al. | 714/785 |

FOREIGN PATENT DOCUMENTS

JP 2009-260692 11/2009
KR 10-0939334 A 6/2009

* cited by examiner

*Primary Examiner* — Daniel McMahon
(74) *Attorney, Agent, or Firm* — Volentine & Whitt, PLLC

(57) ABSTRACT

A memory controller includes a register configured to store a parity check matrix, and an error correcting code (ECC) decoder configured to perform error bit correction on data supplied from a non-volatile memory device using the parity check matrix. The parity check matrix includes N column matrices, where N is a natural number. Each of the N column matrices includes multiple sub-matrices, and a last sub-matrix of the multiple sub-matrices of each column matrix, which is a non-zero valued matrix that comes last in an decoding sequence of the ECC decoder, is an identity matrix.

20 Claims, 11 Drawing Sheets

$$H = \begin{bmatrix}
\begin{array}{ccc|ccc|ccc|c|ccc}
 & 1 & & & 2 & & & 3 & & \cdots & & N & \\
\end{array}
\end{bmatrix}$$

(figure showing block matrix H with 3×3 permutation sub-blocks labeled b-1, b-2, a-1, c-1, b-3, a-2, b-4, c-2, a-3, a-4, c-3, c-4 across rows 1 through M)

FIG. 3B $$H_b = \begin{bmatrix} \begin{array}{ccccc} 1 & 2 & 3 & \cdots & N \\ -1 & 1 & -1 & & 1 \\ -1 & 2 & -1 & & 2 \\ 1 & -1 & 1 & \cdots & 2 \\ 2 & 2 & -1 & & -1 \\ -1 & 0 & 2 & & -1 \\ & \vdots & & & \vdots \\ 1 & -1 & -1 & & 0 \\ 0 & -1 & 2 & \cdots & -1 \\ -1 & -1 & 0 & & -1 \end{array} \end{bmatrix} \begin{array}{c} 1 \\ 2 \\ 3 \\ 4 \\ 5 \\ \vdots \\ M-2 \\ M-1 \\ M \end{array}$$

MEMORY CONTROLLER AND METHOD OF OPERATING THE SAME

CROSS-REFERENCE TO RELATED APPLICATION

A claim for priority under 35 U.S.C. §119 is made to Korean Patent Application No. 10-2012-0143768 filed on Dec. 11, 2012, in the Korean Intellectual Property Office, the entire contents of which are hereby incorporated by reference.

BACKGROUND

Embodiments of the inventive concept relate to a memory controller controlling a nonvolatile memory and an operating method of the same.

Memory devices may be classified into volatile memory devices and non-volatile memory devices. Volatile memory devices lose stored data when the power supply is interrupted. In contrast, non-volatile memory devices retain stored data even when the power supply is interrupted.

Examples of non-volatile memory devices include read only memory (ROM), erasable programmable (EPROM), electrically erasable programmable (EEPROM), and so forth. The configuration and operation of a flash memory device introduced as flash EEPROM, for example, are different from those of a conventional EEPROM. The flash memory device performs an electric erase operation in units of blocks and performs a program operation in units of bits.

SUMMARY

Embodiments of the inventive concept provide a memory controller, which has an improved error bit correcting speed and reduced power consumption, and can reduce the layout complexity in hardware.

Embodiments of the inventive concept also provide an operating method of a memory controller, which has an improved error bit correcting speed and reduced power consumption, and can reduce the layout complexity in hardware.

These and other objects will be described in or be apparent from the following description of illustrative embodiments.

According to an aspect of the inventive concept, a memory controller includes a register configured to store a parity check matrix, and an error correcting code (ECC) decoder configured to perform error bit correction on data supplied from a non-volatile memory device using the parity check matrix. The parity check matrix includes N column matrices, where N is a natural number. Each of the N column matrices includes multiple sub-matrices, and a last sub-matrix of the multiple sub-matrices of each column matrix, which is a non-zero valued matrix that comes last in an decoding sequence of the ECC decoder, is an identity matrix.

According to another aspect of the inventive concept, a memory controller includes a register configured to store a parity check matrix, and an error correcting code (ECC) decoder configured to perform error bit correction of data provided from a nonvolatile memory. The ECC decoder includes a cyclic shifter, a decoding processor, and a parity check unit. The cyclic shifter is connected to an input port of the decoding processor, and configured to perform cyclic shifting on the data from the nonvolatile memory using the parity check matrix. The decoding processor is configured to decode the cyclic shifted data, providing a decoding result. The parity check unit is connected to an output port of the decoding processor, and configured to check error bits of the decoding result. No separate cyclic shifter is connected to the output port of the decoding processor.

According to another aspect of the inventive concept, A method is provided for operating a memory controller. The method includes performing first cyclic shifting using first parity check matrix data from a variable node memory and data read from a non-volatile memory device to provide a first cyclic shifting result; performing first error bit correction decoding using the first cyclic shifted data to provide a first error bit correction decoding result; providing the first error bit correction decoding result to a parity check unit to check whether the first error bit correction decoding result includes error bits exceeding a reference value; and when the first error bit correction decoding result includes error bits exceeding the reference value, performing second cyclic shifting using the first error bit correction decoding result and the parity check matrix data to provide a second cyclic shifting result, and performing second error bit correction decoding using the second cyclic shifting result and the first error bit correction decoding result to provide a second error bit correction decoding result.

BRIEF DESCRIPTION OF THE DRAWINGS

The above and other features and advantages will become more apparent by from the following description with reference to the following figures, in which like reference numerals refer to like parts throughout the various figures unless otherwise specified, in which.

DETAILED DESCRIPTION

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description. In the drawings, the sizes and relative sizes of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

Use of the terms "a" and "an" and "the" and similar referents in the context of describing embodiments the inventive concept (including in the context of the following claims) are to be construed to cover both the singular and the plural, unless otherwise indicated herein or clearly contradicted by context. The terms "comprising," "having," "including," and "containing" are to be construed as open-ended terms (meaning "including, but not limited to,") unless otherwise noted.

It will be understood that, although the terms first, second, etc., may be used herein to describe various elements, these elements should not be limited by these terms. These terms are only used to distinguish one element from another element. Thus, for example, a first element, a first component or a first section discussed below could be termed a second element, a second component or a second section without departing from the teachings of the inventive concept.

The terms "unit" and "module," as used herein, mean, but are not limited to, a software or hardware component, such as a field programmable gate array (FPGA) or an application specific integrated circuit (ASIC), which performs certain tasks. A unit or module may advantageously be configured to reside in the addressable storage medium and configured to execute on one or more processors. Thus, a unit or module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units or modules may be combined into fewer components and units or modules or further separated into additional components and units or modules.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted FIG. 1 is a block diagram of a non-volatile memory system, according to an embodiment of the inventive concept.

Figure 1:
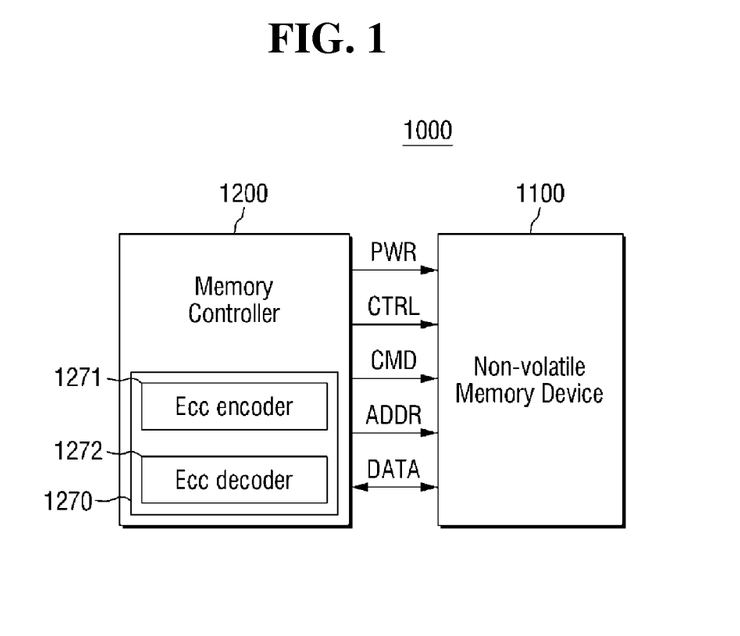
FIG. 1 is a block diagram of a non-volatile memory system, according to an embodiment of the inventive concept.

Referring to FIG. 1, non-volatile memory system 1000 includes a non-volatile memory device 1100 and a memory controller 1200. The non-volatile memory system 1000 shown in FIG. 1 may include various kinds of data storage media based on a non-volatile memory, such as a memory card, a USB memory, or SSD, without departing from the scope of the present teachings.

The memory controller 1200 generally controls operation of the non-volatile memory device 1100. The memory controller 1200 includes an error correction code (ECC) engine 1270 for correcting error bits. The ECC engine 1270 includes an ECC encoder 1271 and an ECC decoder 1272.

The non-volatile memory device 1100 may perform erase, write and/or read operations under the control of the memory controller 1200. To this end, the non-volatile memory device 1100 receives a command CMD, an address ADDR and data DATA through input/output lines. In addition, the non-volatile memory device 1100 receives power PWR through a power line and a control signal CTRL through a control line. The control signal CTRL may include a command latch enable signal CLE, an address latch enable signal ALE, a chip enable signal nCE, a write enable signal nWE, a read enable signal nRE, and so on.

The ECC engine 1270 performs error bit correction. The ECC encoder 1271 of the ECC engine 1270 performs error correction encoding on data to be programmed in the non-volatile memory device to form data with an additional parity bit. The parity bit may be stored in the non-volatile memory device 1100. In addition, the ECC decoder 1272 performs error correction decoding on the data read from the non-volatile memory 1100, determines whether the error correction decoding is successfully performed according to the result of the error correction decoding, and outputs an instruction signal according to the determination result. The ECC decoder 1272 corrects error bits of data using the parity bit generated during the ECC encoding. When the number of error bits is greater than a correctable error bit limit (reference) value, the ECC engine 1270 is unable to correct the error bits, resulting in an error correction fail.

The ECC engine 1270 may perform error correction by coded modulation, such as a low density parity check (LDPC) code, a BCH code, a turbo code, a Reed-Solomon code, a convolution code, a recursive systematic code (RSC), a trellis-coded modulation (TCM), a block coded modulation (BCM), for example, although embodiments of the inventive concept are not limited thereto. The ECC engine 1270 may include any type of circuit, system and device capable of performing error correction.

As described above, when the number of error bits is greater than the correctable error bit limit value of the ECC engine 1270, an error correction fail may be generated. According to embodiments of the inventive concept, the ECC engine 1270 performs error bit correction using hard decision data and/or soft decision data, thereby increasing error bit correcting capability. In the case of using LDPC code, for example, the ECC engine 1270 performs error bit correction using a log likelihood ratio soft decision data, thereby providing excellent error correcting capability.

As shown in FIG. 1, the non-volatile memory device 1100 may include flash memory, electrically erasable programmable read-only memory (EEPROM), ferroelectrics random access memory (FRAM), phase change random access memory (PRAM), magnetoresistive random access memory (MRAM), and so on. In addition, referring to FIG. 1, the non-volatile memory device 1100 may serve as a storage unit that stores data provided from the memory controller 1200. The non-volatile memory device 1100 may be a NAND flash memory device, for example.

Figure 2:
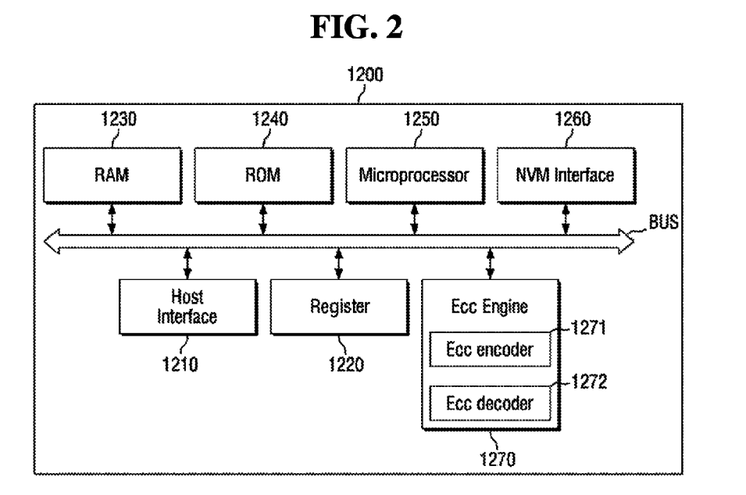
FIG. 2 is a block diagram of a memory controller shown in FIG. 1, according to an embodiment of the inventive concept.

FIG. 2 is a detailed block diagram of a memory controller shown in FIG. 1, according to an embodiment of the inventive concept.

Referring to FIG. 2, the controller 1200 includes a microprocessor 1250, RAM 1230, ROM 1240, an ECC engine 1270, a register 1220, a host interface 1210 and a non-volatile memory (NVM) interface 1260. The microprocessor 1250, the RAM 1230, the ROM 1240, the ECC engine 1270, the register 1220, the host interface 1210 and the non-volatile memory interface 1260 may be electrically connected through a bus.

The non-volatile memory interface 1260 provides interfacing between the controller 1200 and the non-volatile memory device 1100. For example, commands controlled by the microprocessor 1250 may be provided to the non-volatile memory device 1100 as shown in FIG. 1 through the non-volatile memory interface 1260. In addition, data may be transmitted from the controller 1200 to the non-volatile memory device 1100, and from the non-volatile memory device 1100 to the controller 1200 through the non-volatile memory interface 1260.

The host interface 1210 provides interfacing between the memory system 1000 including the controller 1200 and host (not shown) in accordance with a predetermined protocol. For example, the host interface 1210 may communicate with an external host through one or more of a universal serial bus (USB), small computer system interface (SCSI), peripheral component interconnect (PCI) express, advance technology attachment (ATA), parallel ATA (PATA), serial ATA (SATA), or serial attached SCSI (SAS) interface.

The microprocessor 1250 may be implemented by circuits, logic, codes, software, firmware, hardware or combinations thereof, and may generally control the operation of the memory system 1000 including a micro controller 1200. When power is applied to the memory system 1000, the microprocessor 1250 drives firmware stored in the ROM 1240 on the RAM 1230 to operate the memory system 1000, thereby controlling the overall operation of the memory system 1000. In addition, the microprocessor 1250 analyzes commands applied from the host and may control the overall operation of the non-volatile memory device 1100 according to the analysis results.

The ROM 1240 may store firmware codes for driving the memory system 1000, but aspects of the inventive concept are not limited thereto. The firmware codes may be stored in various non-volatile memory devices 1100 in addition to or instead of the ROM 1240, such as NAND flash memory, for example. Therefore, control or interference of the microprocessor 1250 may include directly controlling the microprocessor 1250 in a hardware manner and interference of firmware that is software driven by the microprocessor 1250. The ROM 1240 may also store a parity check matrix used by the ECC engine 1270. Also, the register 1220 may store the parity check matrix used by the ECC engine 1270. The parity check matrix is described below with reference to FIGS. 3A and 3B.

The RAM 1230 may serve as a buffer, for example, and may store initial commands input through host input/output (I/O), data, various variables or data output from the non-volatile memory device 1100. In addition, the RAM 1230 may also store data input to/output from the non-volatile memory device 1100, various parameters and variables.

The ECC engine 1270 performs error bit correction, and includes the ECC encoder 1271 and the ECC decoder 1272, as discussed above. The ECC encoder 1271 performs error correction encoding on the data input through the host interface 1210 of the memory system 1000 and generates a codeword that includes an added parity bit. The codeword may be stored in the non-volatile memory device 1100. The ECC decoder 1272 performs error correction decoding on the output data to provide an error correction decoding result, and determines whether the error correction decoding is successfully performed according to the error correction decoding result. The ECC decoder 1272 outputs an instruction signal according to the determination result. The read data is transmitted to the ECC decoder 1272, and the ECC decoder 1272 may correct error bits of the data using the parity bit. When the number of error bits is greater than a correctable error bit limit value, the ECC decoder 1272 cannot correct the error bits, resulting in an error correction fail.

As described above, various codes may be used as the code used by the ECC engine 1270. However, the ECC engine 1270 using a low density parity check (LDPC) code will be described below by way of example, for purposes of illustration. According to embodiments of the inventive concept, the ECC engine 1270 has a parity check matrix H satisfying the following Equation (1), in which S is a syndrome, H is a parity check matrix, and $c^T$ is a transposed matrix of a codeword c:

$$S = Hc^T = 0 \qquad \text{Equation (1)}$$

The ECC decoder 1272 performs error bit correction on the data from the non-volatile memory device 1100 using the parity check matrix. The ECC decoder 1272 may receive hard decision data or soft decision data that is probability data added to the hard decision data from the non-volatile memory device 1100. When the ECC decoder 1272 fails in error bit correction of the hard decision data, the soft decision data is used to perform error bit correction. According to some embodiments, the parity check matrix used in the ECC decoder 1272 may include multiple sub-matrices, for example, N×M sub-matrices (e.g., N>M). That is, the parity check matrix includes N column matrices, and each of the N column matrices includes multiple sub-matrices. The last sub-matrix of each column matrix of the N column matrices is a non-zero valued matrix, and comes last in an error bit decoding sequence of the ECC decoder. Also, the last sub-matrix of each column matrix is an identity matrix, as described below with reference to FIGS. 3A and 3B.

Figure 3A:
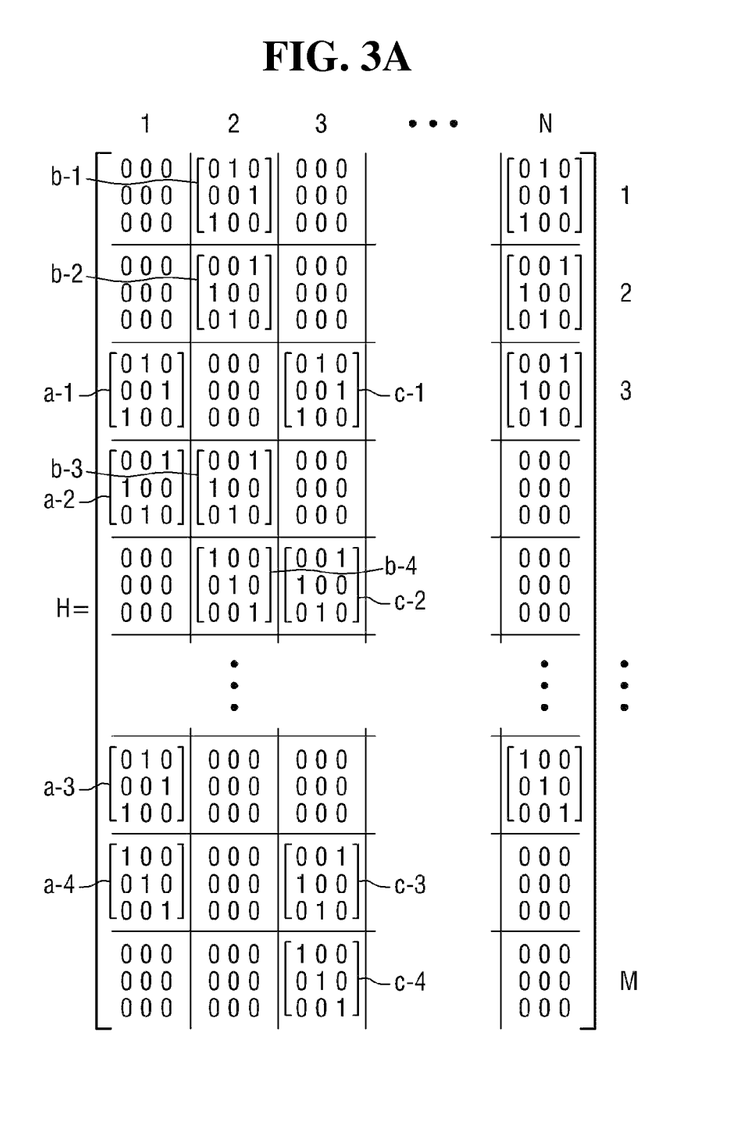
FIGS. 3A and 3B illustrate a parity check matrix used by an ECC decoder shown in FIG. 2, according to embodiments of the inventive concept.
Figure 3B:
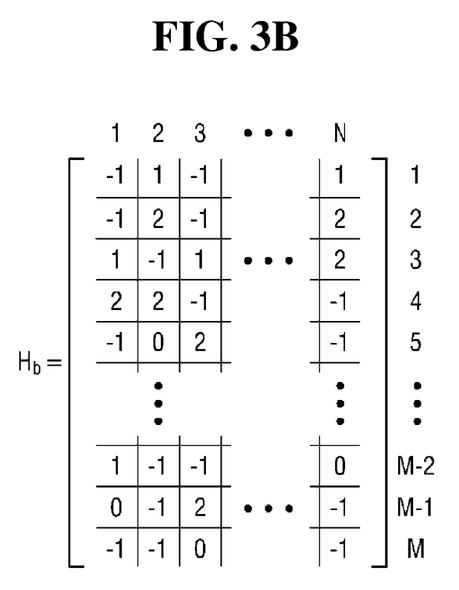

FIGS. 3A and 3B illustrate a parity check matrix used by an ECC decoder shown in FIG. 2, according to embodiments of the inventive concept.

Referring to FIG. 3A, the parity check matrix includes a plurality of sub-matrices. That is, the parity check matrix is composed of N×M sub-matrices (where N and M are natural numbers). In an embodiment, N is greater than M, although alternatively, N may less than or equal to M. Each of the sub-matrices in the parity check matrix may be a square matrix, such as a 3×3 matrix, for example. More generally, each of the sub-matrices may be a K×K square matrix, for example, where K is a natural number smaller than N and/or M. Referring to FIGS. 3A and 3B, in the parity check matrix, the sub-matrices include an identity matrix corresponding to the last row of decoding in each of the respective decoding columns (column matrices) in a predetermined decoding sequence.

Stated differently, the parity check matrix includes N column matrices, and each of the N column matrices includes M sub-matrices. The last sub-matrix of each of the N column matrices, which comes last in the decoding sequence of the ECC decoder, corresponds to an identity matrix. Referring to FIG. 3A, for example, the first column matrix includes (non-zero valued) sub-matrices a-1, a-2, a-3 and a-4, where a-1, a-2 and a-3 are cyclic shifted from identity matrices and a-4 is an identity matrix. For example, the sub-matrix a-1 is generated by cyclic shifting a first identity matrix by 1-bit, and the sub-matrix a-2 is generated by cyclic shifting a second identity matrix by 2-bits. In FIG. 3A, the sub-matrix a-3 is generated by cyclic shifting a third identity matrix by 1-bit, although the sub-matrix a-3 may alternatively be generated by cyclic shifting the third identity matrix 2-bits. The first column matrix includes the identity matrix a-4, and the ECC decoder 1272 finishes performing a decoding operation in the identity matrix a-4. An all zero-valued sub-matrix follows the identity matrix a-4.

Like the first column matrix, the second, third and Nth column matrices are also decoded in a predetermined decoding sequence. Therefore, the second column matrix includes sub-matrices b-1, b-2, b-3 and b-4, where b-1, b-2, and b-3 are generated by cyclic shifting identity matrices, and b-4 is an identity matrix. At least three all zero-valued sub-matrices follow the identity matrix b-4 in the second column matrix. The third column matrix includes sub-matrices c-1, c-2, c-3 and c-4, where c-1, c-2 and c-3 are generated by cyclic shifting identity matrices, and c-4 is an identity matrix.

Referring to FIG. 3B, a parity check matrix is represented by symbolizing the respective sub-matrices shown in FIG. 3A. In particular, in the parity check matrix, each identity matrix is denoted by 0, each sub-matrix generated by cyclic shifting an identity matrix by 1-bit position is denoted by 1, and each sub-matrix generated by cyclic shifting an identity matrix by 2-bit positions is denoted by 2. Each all zero-valued sub-matrix is denoted by −1.

Figure 4:
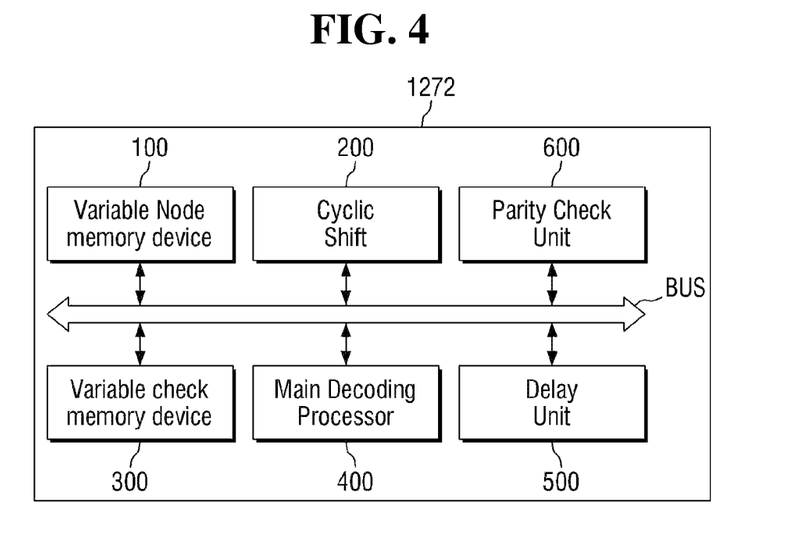
FIG. 4 is a conceptual diagram of an ECC decoder shown in FIG. 2, according to an embodiment of the inventive concept.

FIG. 4 is a conceptual diagram of an ECC decoder shown in FIG. 2, according to an embodiment of the inventive concept.

Referring to FIG. 4, the ECC decoder 1272 includes a variable node memory device 100, a cyclic shifter 200, a main decoding processor 400, a variable check memory device 300, a delay unit 500, and a parity check unit 600.

The variable node memory device 100 receives data from the non-volatile memory device 1100, or receives parity check matrix data from the register 1220 and/or the ROM 1240 of the controller 1200. The parity check matrix may be the same as the parity check matrix shown in FIGS. 3A and 3B, for example.

The data received from the non-volatile memory device 1100 is provided by the variable node memory device 100 to the cyclic shifter 200. The data of the non-volatile memory device 1100 may be hard decision data or soft decision data, as discussed above.

The cyclic shifter 200 performs cyclic shifting using the data received from the variable node memory device 100 and the parity check matrix. The cyclic shifter 200 may receive the parity check matrix data from the ROM 1240 or the register 1220. The cyclic shifted data is provided to the main decoding processor 400 and the delay unit 500. The cyclic shifter 200 may perform cyclic shifting in a column direction of the parity check matrix. Alternatively, the cyclic shifter 200 may also perform cyclic shifting in a row direction of the parity check matrix. The cyclic shifter 200 may perform a 1-bit cyclic shifting or a 2-bit cyclic shifting, for example, when the sub-matrices are 3×3 matrices.

The main decoding processor 400 decodes the cyclic-shifted data. The decoded data is provided to the variable check memory device 300 and the parity check unit 600. The variable check memory device 300 stores decoded data of the decoding result received from the main decoding processor 400. In an embodiment, the cyclic shifter 200 is connected to an input port of a main decoding processor 400, but the cyclic shifter 200 is not provided at an output port of the main decoding processor 400.

The delay unit 500 provides a delay offset value for compensating for a delay created when performing the cyclic shifting to the parity check unit 600. The decoded data and the delay offset value are provided to the variable node memory device 100. The variable node memory device 100 updates the decoded data and the delay offset value, and when the decoded data is failed in error correction, the delay offset value is applied to the stored decoded data to be used for continuous decoding.

The parity check unit 600 checks whether the decoded data includes error bits using the decoded data and the delay unit 500. When the number of error bits exceeds a reference value, it is determined that ECC is failed. Then, the decoded data is reused to perform cyclic shifting, and the decoding is again performed. When it is determined by the parity check unit 600 that the number of error bits is less than the reference value, the ECC decoder 1272 finishes decoding, as described below.

Figure 5:
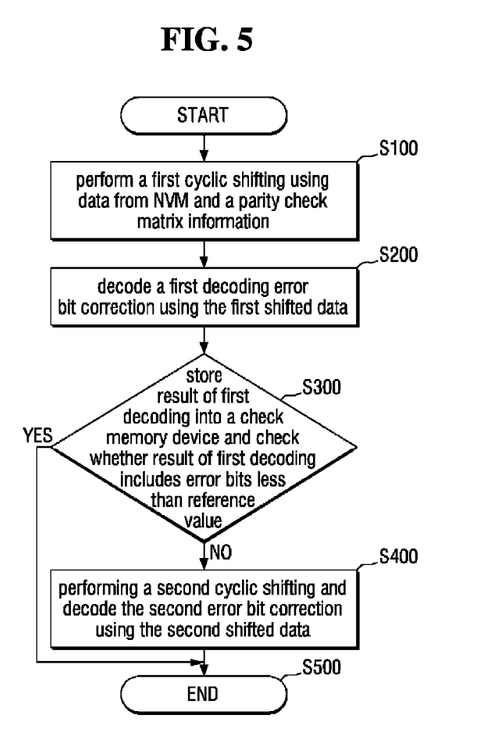
FIG. 5 is a flow diagram illustrating an ECC decoding process of a memory controller, according to another embodiment of the inventive concept.

FIG. 5 is a flow diagram illustrating an ECC decoding process of a memory controller, according to an embodiment of the inventive concept.

Referring to FIG. 5, the cyclic shifter 200 performs a first cyclic shifting using first parity check matrix data received from the variable node memory 100 and the data read from the non-volatile memory device 1100 (S100). The first shifted data is provided to the main decoding processor 300 to perform first error bit correction decoding (S200). The first decoding result is stored in the variable check memory 300 and provided to the parity check unit 600 to check whether the first decoding result includes error bits greater than a reference value (S300). If the first decoding result includes error bits less than the reference value, the performing of the decoding process is finished (S500). If the first decoding result includes error bits greater than the reference value, the cyclic shifter 200 performs a second cyclic shifting using the first decoding result and parity check matrix data, and the main decoding processor 400 performs second error correction decoding using the second cyclic shifting result and the first decoding result received from the variable check memory device 300 (S400). This process may be repeated until the respective decoding result includes error bits less than the reference value. For example, if the second decoding result includes error bits greater than the reference value, the cyclic shifter 200 performs a third cyclic shifting using the second decoding result and the parity check matrix data to provide a third cyclic shifting result, and the main decoding processor 400 performs third error correction decoding using the third cyclic shifting result and the second decoding result received from the variable check memory device 300.

Figure 6:
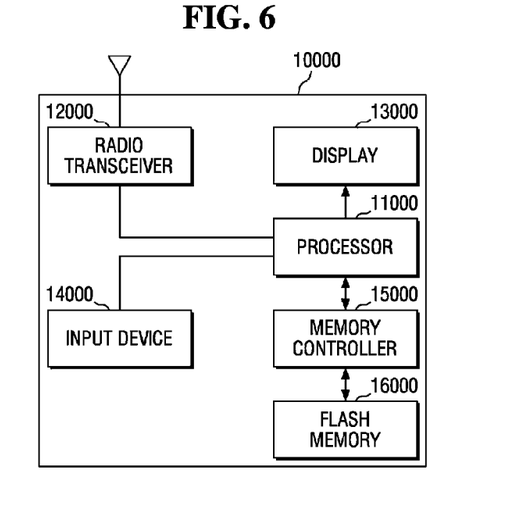
FIG. 6 is a block diagram of an electronic device including a memory controller and a non-volatile memory device, according to an embodiment of the inventive concept.

FIG. 6 is a block diagram of an electronic device including a memory controller and a non-volatile memory system, according to an embodiment of the inventive concept.

Referring to FIG. 6, the electronic device 10000 include a non-volatile memory device 16000 that may be implemented by a flash memory device, such as a cellular phone, a smart phone, or a tablet PC, and a memory controller 15000 that controls operation of the non-volatile memory device 16000. The non-volatile memory device 16000 may be implemented by the non-volatile memory device discussed above with reference to FIGS. 1 to 5. The non-volatile memory device 16000 may store random data.

The memory controller 15000 is controlled by a processor 11000 controlling the overall operation of the electronic device 10000. The memory controller 15000 may be implemented by the memory controller discussed above with reference to FIGS. 1 to 5.

The data stored in the non-volatile memory device 16000 may be displayed through a display 13000 under the control of the memory controller 15000 operating by the control of the processor 11000.

A wireless transceiver 12000 transmit and/or receive RF signals through an antenna ANT. For example, the wireless transceiver 12000 may convert the RF signal received through the antenna ANT into a signal that can be processed by the processor 11000. Therefore, the processor 11000 may process the signal output from the wireless transceiver 12000, and may store the processed signal in the non-volatile memory device 16000 through the memory controller 15000 and/or may display the processing results through the display 13000. The wireless transceiver 12000 may convert the signal output from the processor 11000 into an RF signal and may output the converted RF signal to the outside through the antenna ANT.

The input device 14000 is a device that can input a control signal for controlling operation of the processor 11000 and/or the data to be processed by the processor 11000. The input device 14000 may be implemented by a pointing device, such as a touch pad or a computer mouse, a keypad, or a keyboard, for example.

The processor 11000 may control the display 13000 to display the data output from the non-volatile memory device 16000, the RF signal output from the wireless transceiver 12000 and/or the data output from the input device 14000.

Figure 7:
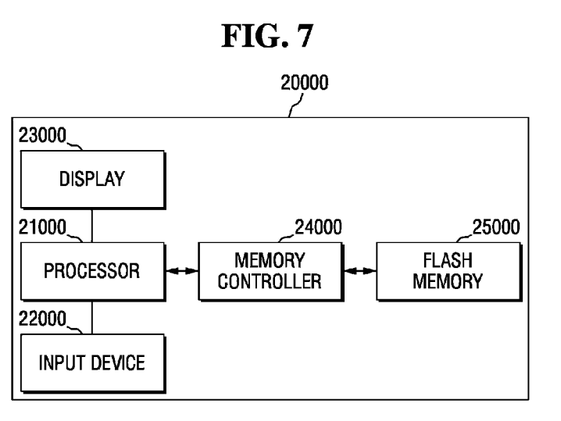
FIG. 7 is a block diagram of an electronic device including a memory controller and a non-volatile memory device, according to another embodiment of the inventive concept.

FIG. 7 is a block diagram of an electronic device including a memory controller and a non-volatile memory device, according to another embodiment of the inventive concept.

Referring to FIG. 7, the electronic device 20000 may be implemented by a data processing device, such as a personal computer (PC), a tablet computer, a net-book, an e-reader, a personal digital assistant (PDA), a portable multimedia player (PMP), an MP3 player, or an MP4 player, for example. The electronic device 20000 includes a non-volatile memory device 25000, such as a flash memory device, and a memory controller 24000 capable of controlling operation of the non-volatile memory device 25000. The non-volatile memory device 25000 and the memory controller 24000 may be implemented by the non-volatile memory device and the memory controller discussed above with reference to FIGS. 1 to 5. The non-volatile memory device 25000 may store random data.

The electronic device 20000 further includes a processor 21000 for controlling overall operation of the electronic device 20000. The memory controller 24000 may be controlled by the processor 21000. The processor 21000 may display the data stored in the non-volatile memory device 25000 through a display 23000 according to the input signal generated by the input device 22000. For example, the input device 22000 may be implemented by a pointing device, such as a touch pad or a computer mouse, a keypad, or a keyboard.

Figure 8:
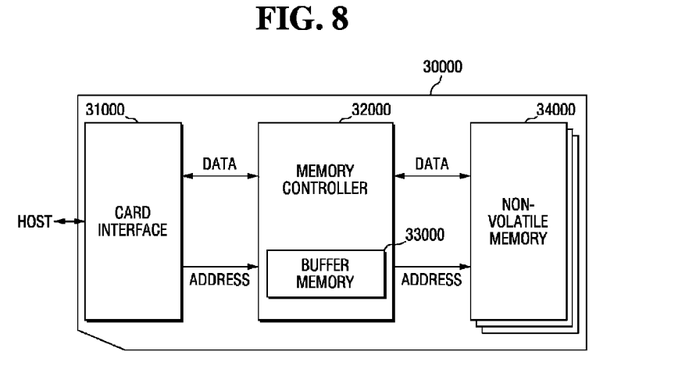
FIG. 8 is a block diagram of an electronic device including a memory controller and a non-volatile memory device, according to another embodiment of the inventive concept.

FIG. 8 is a block diagram of an electronic device including a non-volatile memory device, according to another embodiment of the inventive concept.

Referring to FIG. 8, the electronic device 30000 includes a card interface 31000, a memory controller 32000, and a non-volatile memory device 34000, such as a flash memory device.

The electronic device 30000 may exchange data with a host through the card interface 31000. According to various embodiments, the card interface 31000 may be a secure digital (SD) card interface or a multi-media card (MMC) interface, although aspects of the inventive concept are not limited thereto. The card interface 31000 may interface data exchange between the host and the memory controller 32000 according to the communication protocol of the host capable of communicating with the electronic device 30000.

The memory controller 32000 may control overall operation of the electronic device 30000 and may control data exchange between the card interface 31000 and the non-volatile memory device 34000. The memory controller 32000 is connected to the card interface 31000 and the non-volatile memory device 34000 through a data bus DATA and an address bus ADDRESS.

According to various embodiments, the memory controller 32000 receives addresses of data to be read from or written to the card interface 31000 through the address bus ADDRESS, and transmits the received addresses to the non-volatile memory device 34000. In addition, the memory controller 32000 may receive and/or transmit the data to be read or written through the data bus DATA connected to the card interface 31000 or the non-volatile memory device 34000.

The non-volatile memory device 34000 and the memory controller 32000 may be implemented by the non-volatile memory device and the memory controller discussed above with reference to FIGS. 1 to 5. The non-volatile memory device 34000 may store random data.

When the electronic device 30000 shown in FIG. 8 is connected to a host, such as a PC, a tablet PC, a digital camera, a digital audio player, a mobile phone, a console video game hardware, or a digital set-top box, for example, the host may transmit or receive the data stored in the non-volatile memory device 34000 through the card interface 31000 and the memory controller 32000.

Figure 9:
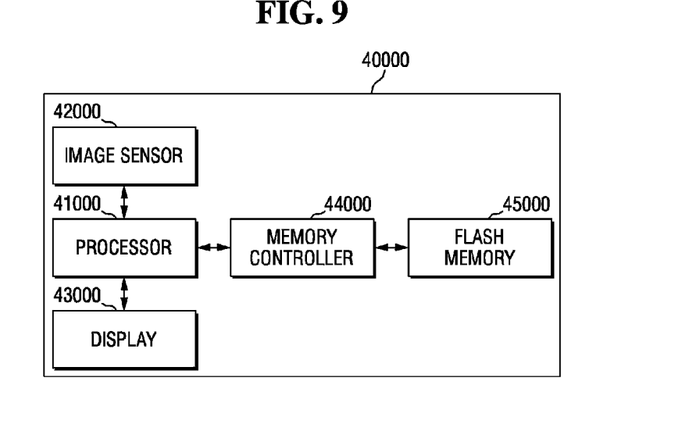
FIG. 9 is a block diagram of an electronic device including a memory controller and a non-volatile memory device, according to another embodiment of the inventive concept.

FIG. 9 is a block diagram of an electronic device including a memory controller and a non-volatile memory device, according to another embodiment of the inventive concept.

Referring to FIG. 9, the electronic device 40000 includes a non-volatile memory device 45000, such as a flash memory device, a memory controller 44000 for controlling the data processing operation of the non-volatile memory device 45000. The electronic device 40000 further includes an image sensor 42000 capable of controlling the overall operation of the electronic device 40000.

The non-volatile memory device 45000 and the memory controller 44000 may be implemented by the non-volatile memory device and the memory controller discussed above with reference to FIGS. 1 to 5. The non-volatile memory device 45000 may store random data.

In addition, the memory controller 44000 includes a first register block for performing first cyclic shifting using a first parameter, a second register block for performing second cyclic shifting using a second parameter, and a seed block for generating a seed using cyclic shifting results performed by the first and second register blocks. The memory controller 44000 may randomize original data into random data using the generated seed.

The image sensor 42000 of the electronic device 40000 may convert an optical signal into a digital signal, and the converted digital signal may be stored in the non-volatile memory device 45000 under the control of the processor 41000 and/or may be displayed through the display 43000. In addition, the digital signal stored in the non-volatile memory device 45000 is displayed through the display 43000 under the control of the processor 4100 and/or the image sensor 42000.

Figure 10:
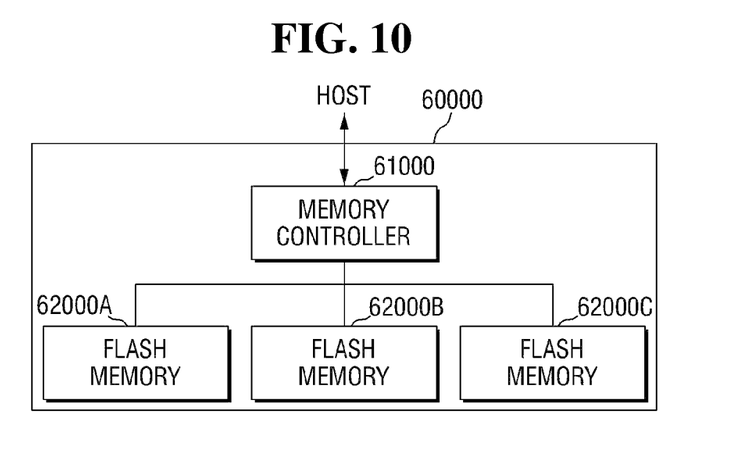
FIG. 10 is a block diagram of an electronic device including a memory controller and a non-volatile memory device, according to another embodiment of the inventive concept.

FIG. 10 is a block diagram of an electronic device including a memory controller and a non-volatile memory device, according to another embodiment of the inventive concept.

Referring to FIG. 10, the electronic device 60000 may be implemented as a data storage device, such as a solid state drive (SSD).

The electronic device 60000 may include a plurality of non-volatile memory devices 62000A, 62000B and 62000C, and a memory controller 61000 capable of controlling the data processing operations of the non-volatile memory devices 62000A, 62000B and 62000C. The non-volatile memory devices 62000A, 62000B and 62000C and the memory controller 61000 may be implemented by the non-volatile memory device and the memory controller as discussed above with reference to FIGS. 1 to 5. According to various embodiments, the memory controller 61000 may be provided inside or outside the electronic device 60000.

Figure 11:
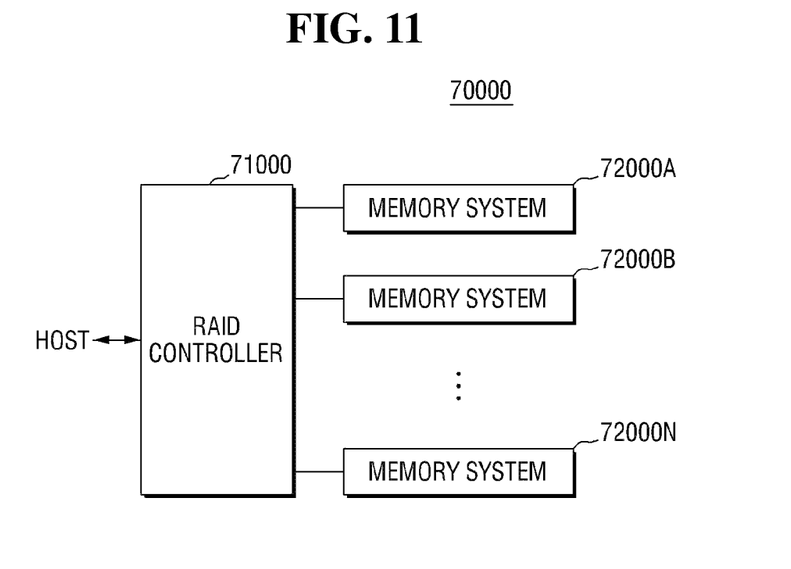
FIG. 11 is a block diagram of a data processing system including the electronic device shown in FIG. 10, according to an embodiment of the inventive concept.

FIG. 11 is a block diagram of a data processing system including the electronic device shown in FIG. 10, according to another embodiment of the inventive concept.

Referring to FIGS. 10 and 11, the data storage device 70000 includes a RAID controller 71000 implemented by a redundant array of independent disks (RAID) system, and a plurality of memory systems 72000A and 72999B to 72000N, where N is a natural number. The memory systems 72000A and 72999B to 72000N may constitute a RAID array. The data storage device 70000 may be implemented by a personal computer (PC) or a solid state drive (SSD), for example.

During a program operation, the RAID controller 71000 outputs program data output from a host to one of the memory systems 72000A and 72999B to 72000N according to a RAID level selected from a plurality of RAID levels based on RAID level information output from the host.

In addition, during a read operation, the RAID controller 71000 transmits to the host the data read from one of the memory systems 72000A and 72000B to 72000N according to a RAID level selected from the plurality of RAID levels based on RAID level information output from the host.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A memory controller, comprising:
a register configured to store a parity check matrix; and
an error correcting code (ECC) decoder configured to perform error bit correction on data supplied from a non-volatile memory device using the parity check matrix, the parity check matrix including N column matrices, where N is a natural number,
wherein each of the N column matrices comprises a plurality of sub-matrices, and a last sub-matrix of the plurality of sub-matrices of each column matrix is an identity matrix, the last sub-matrix being a non-zero valued matrix that comes last in a decoding sequence of the ECC decoder.

2. The memory controller of claim 1, wherein the ECC decoder comprises a cyclic shifter configured to perform a cyclic shifting using the parity check matrix.

3. The memory controller of claim 2, wherein the cyclic shifter is connected to an input port of a main decoding processor.

4. The memory controller of claim 3, wherein the cyclic shifter is not provided at an output port of the main decoding processor.

5. The memory controller of claim 3, wherein the parity check matrix is represented by symbolizing the plurality of sub-matrices of each N column matrix.

6. The memory controller of claim 5, wherein each sub-matrix comprising an identity matrix is denoted by 0 in the parity check matrix, each sub-matrix generated by cyclic shifting an identity matrix by 1-bit position is denoted by 1 in the parity check matrix, and each sub-matrix generated by cyclic shifting an identity matrix by 2-bit positions is denoted by 2 in the parity check matrix.

7. The memory controller of claim 6, wherein each sub-matrix comprising an all zero-valued sub-matrix is denoted by −1 in the parity check matrix.

8. A memory controller comprising:
a register configured to store a parity check matrix; and
an error correcting code (ECC) decoder configured to perform error bit correction of data provided from a non-volatile memory, the ECC decoder comprising:
a cyclic shifter connected to an input port of a decoding processor, and configured to perform cyclic shifting on the data from the nonvolatile memory using the parity check matrix to provide cyclic shifted data;
the decoding processor configured to decode the cyclic shifted data, providing a decoding result; and
a parity check unit connected to an output port of the decoding processor, and configured to check error bits of the decoding result, wherein no separate cyclic shifter is connected to the output port of the decoding processor.

9. The memory controller of claim 8, wherein the parity check matrix comprises N column matrices, where N is a natural number, each of the N column matrices comprises a plurality of sub-matrices, and a last sub-matrix of the plurality of sub-matrices in each of the N column matrices, which is a non-zero valued matrix and comes last in a decoding sequence of the ECC decoder, is an identity matrix.

10. The memory controller of claim 8, wherein the data is soft decision data or hard decision data.

11. The memory controller of claim 8, wherein the decoding processor provides the decoding result to a variable check memory for storing the decoding result.

12. The memory controller of claim 8, wherein the ECC decoder further comprises:
a delay compensation unit configured to provide a delay offset value for compensating for a delay due to performing the cyclic shifting.

13. The memory controller of claim 12, wherein the parity check unit is further configured to check whether the decoding result includes error bits, using the decoding result of the decoding processor and the delay offset value.

14. The memory controller of claim 8, wherein the cyclic shifter is further configured to perform cyclic shifting in a column direction or a row direction of the parity check matrix.

15. The memory controller of claim 8, wherein performing the cyclic shifting comprises performing 1-bit cyclic shifting.

16. The memory controller of claim 8, wherein the cyclic shifting performed by the cyclic shifter comprises 2-bit cyclic shifting.

17. A method of operating a memory controller, the method comprising:
performing first cyclic shifting using parity check matrix data from a variable node memory and data read from a non-volatile memory device to provide a first cyclic shifting result;
performing first error bit correction decoding using the first cyclic shifted data to provide a first error bit correction decoding result;
providing the first error bit correction decoding result to a parity check unit to check whether first error bits included in the first error bit correction decoding result exceed a reference value; and
when the first error bits included in the first error bit correction decoding result exceed the reference value, performing second cyclic shifting using the first error bit correction decoding result and the parity check matrix data to provide a second cyclic shifting result, and performing second error bit correction decoding using the second cyclic shifting result and the first error bit correction decoding result to provide a second error bit correction decoding result.

18. The operating method of claim 17, further comprising: storing the first error bit correction decoding result in a variable check memory, wherein performing the second error bit correction decoding includes reading the first error bit correction decoding result from the variable check memory.

19. The operating method of claim 18, further comprising: storing the second error bit correction decoding result in the variable check memory; and
when second error bits included in the second error bit correction decoding result exceed the reference value, performing third cyclic shifting using the second error bit correction decoding result and the parity check matrix data to provide a third cyclic shifting result.

20. The operating method of claim 18, further comprising: performing third error bit correction decoding in the decoding processor using the third cyclic shifting result and the second error bit correction decoding result to provide a third error bit correction decoding result.

* * * * *